US008114772B2

(12) United States Patent
Lee et al.

(10) Patent No.: US 8,114,772 B2
(45) Date of Patent: Feb. 14, 2012

(54) METHOD OF MANUFACTURING THE SEMICONDUCTOR DEVICE

(75) Inventors: Kyu-Ha Lee, Yongin-si (KR); Min-Seung Yoon, Seoul (KR); Ui-Hyoung Lee, Seoul (KR); Ju-Ii Choi, Suwon-si (KR); Nam-Seog Kim, Yongin-si (KR); Keum-Hee Ma, Suwon-si (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 12/906,578

(22) Filed: Oct. 18, 2010

(65) Prior Publication Data

US 2011/0097891 A1 Apr. 28, 2011

(30) Foreign Application Priority Data

Oct. 26, 2009 (KR) .................. 10-2009-0101623

(51) Int. Cl.
*H01L 21/44* (2006.01)

(52) U.S. Cl. ........ 438/667; 257/621; 257/773; 257/774; 257/E23.011; 257/E23.024; 257/E23.145; 257/E23.169; 257/E21.476; 257/E29.111

(58) Field of Classification Search .................. 257/621, 257/773, 774, E23.011, E23.024, E23.145, 257/E23.169, E21.476, E29.111; 438/667
See application file for complete search history.

(56) References Cited

U.S. PATENT DOCUMENTS

| 2004/0251554 A1* | 12/2004 | Masuda .................. 257/773 |
| 2007/0052088 A1* | 3/2007 | Tsurume et al. ............ 257/707 |
| 2008/0169570 A1* | 7/2008 | Saito .................. 257/774 |
| 2008/0258267 A1* | 10/2008 | Nakashima ............... 257/621 |
| 2009/0121323 A1* | 5/2009 | Kwon et al. ............. 257/621 |
| 2009/0243046 A1* | 10/2009 | Shi et al. ................ 257/621 |

FOREIGN PATENT DOCUMENTS

| JP | 2005-038942 | 2/2005 |
| JP | 2006-203139 | 8/2006 |
| JP | 2007-173634 | 7/2007 |

OTHER PUBLICATIONS

English Abstract for Publication No. 2005-038942.
English Abstract for Publication No. 2006-203139.
English Abstract for Publication No. 2007-173634.

* cited by examiner

*Primary Examiner* — Eugene Lee
*Assistant Examiner* — Peniel M Gumedzoe
(74) *Attorney, Agent, or Firm* — F. Chau & Associates, LLC

(57) ABSTRACT

A method of manufacturing semiconductor device includes preparing a substrate having a first surface and a second surface opposite to the first surface. A first insulation layer is formed on the second surface. A sacrificial layer is formed on the first insulation layer. An opening is formed to penetrate through the substrate and extend from the first surface to a portion of the sacrificial layer. A second insulation layer is formed on an inner wall of the opening. A plug is formed to fill the opening. The sacrificial layer is removed to expose a lower portion of the plug through the second surface.

20 Claims, 6 Drawing Sheets

METHOD OF MANUFACTURING THE SEMICONDUCTOR DEVICE

PRIORITY STATEMENT

This application claims priority under 35 U.S.C. §119 from Korean Patent Application No. 2009-101623, filed on Oct. 26, 2009 in the Korean Intellectual Property Office (KIPO), the contents of which are herein incorporated by reference in their entirety.

BACKGROUND

1. Field

Exemplary embodiments of the inventive concept are directed to a semiconductor device and a method of manufacturing the semiconductor device. More particularly, exemplary embodiments of the inventive concept are directed to a semiconductor device including a through-electrode for an electrical connection and a method of manufacturing the semiconductor device.

2. Description of the Related Art

As device speeds and device integration increase, signal delays may also increase, for example, due to parasitic capacitance introduced by interconnection structures. Advances in integration technology have led to the development of three-dimensional integration, where wafers may be stacked three-dimensionally, in contrast to the conventional two-dimensional approach.

In a three-dimensional wafer stack package (WSP), a structure called a through-silicon via (TSV) can be used to extend the via hole through a substrate so that a conductive via may be formed to vertically extend and completely penetrate through the substrate. Such a TSV structure may provide higher speeds, higher integration, and improved functionality in comparison to a long wire pattern interconnection. For example, the conductive via may be formed using copper (Cu) having a low resistance. However, copper is known to have high diffusivity in silicon.

A conventional TSV may be formed through the substrate before back end processing. In particular, the TSV structure may be formed by forming an opening or hole in a substrate, such as a silicon substrate. An insulation layer may be formed on the substrate and in the opening. A conductive metal layer, such as a copper (Cu) layer, may be formed in the opening, for example, by a plating process or a deposition process. A backside of the substrate may then be recessed to expose at least a portion of the conductive metal layer, thereby forming a conductive via extending through the substrate. In this case, the substrate including the conductive via may be repeatedly exposed during processes such as an etch process. In particular, when a portion of the conductive metal layer is exposed during an etch process, the metal of the conductive metal layer such as copper may diffuse into the substrate to thereby deteriorate a semiconductor device such as a semiconductor chip.

SUMMARY

Exemplary embodiments of the inventive concept provide a semiconductor device capable of preventing a metal material of a through electrode therein from diffusing into the semiconductor device during a manufacturing process.

Exemplary embodiments of the inventive concept provide a method of manufacturing the semiconductor device.

According to exemplary embodiments, a semiconductor device includes a substrate, a plug, a first insulation layer and a second insulation layer. The substrate has a first surface and a second surface opposite to the first surface. The plug penetrates through the substrate and includes a first connection portion exposed through the first surface and a second connection portion exposed through the second surface. The first insulation layer is formed on the second surface. The second insulation layer is formed on outer surfaces of the plug in the substrate and the second connection portion.

In an exemplary embodiment, the semiconductor device may further include a connection member formed on the first connection portion.

In an exemplary embodiments the semiconductor device may further include a second semiconductor chip. The second semiconductor chip is provided on the first semiconductor chip and electrically connected to the first semiconductor chip by the connection member.

According to exemplary embodiments, a method of manufacturing semiconductor device includes preparing a substrate having a first surface and a second surface opposite to the first surface. A first insulation layer is formed on the second surface. A sacrificial layer is formed on the first insulation layer. An opening is formed to penetrate through the substrate and extend from the first surface into a portion of the sacrificial layer. A second insulation layer is formed on an inner wall of the opening. A plug is formed to fill the opening. The sacrificial layer is removed to expose a lower portion of the plug through the second surface.

In an exemplary embodiment, the method may further include partially removing the second surface of the substrate, prior to forming the first insulation layer.

In an exemplary embodiment, the sacrificial layer may be formed using an insulating material having an etch selectivity that differs with respect to that of the first insulation layer. The sacrificial layer may include a polymer.

In an exemplary embodiment, the second insulation layer may be formed using an insulating material having an etch selectivity that differs with respect to that of the sacrificial layer.

In an exemplary embodiment, the plug may be formed by an electroplating process.

In an exemplary embodiment, removing the sacrificial layer may include partially removing the sacrificial layer to expose the second insulation layer on a lower surface of the plug, removing the exposed second insulation layer to expose the lower surface of the plug and completely removing the sacrificial layer.

In this case, the sacrificial layer may be partially and completely removed by an etch process to expose the second insulation layer on the lower surface of the plug.

In another exemplary embodiment, removing the sacrificial layer may include partially removing the sacrificial layer by a first process to expose a lower surface of the plug and completely removing the sacrificial layer by a second process.

In this case, the first process may be a chemical mechanical polishing process, and the second process may be an etch process.

In still another exemplary embodiment, the method may further include forming a connection member on the plug exposed through the first surface. The connection member may include solder.

In still another exemplary embodiment, the method may further include adhering a second semiconductor device to the first surface of the substrate, the second semiconductor device being electrically connected to the first semiconductor chip by the connection member.

According to exemplary embodiments, a semiconductor device includes a first semiconductor chip, a plug penetrating the first semiconductor chip, a connection member formed on the plug, and a second semiconductor chip provided on the first semiconductor chip and electrically connected to the first semiconductor chip by the connection member. The first semiconductor chip includes a first surface and a second surface opposite to the first surface, the plug includes a first connection portion exposed through the first surface and a second connection portion exposed through the second surface, and the connection member is formed on the first connection portion. A first insulation layer is formed on the second surface, and a second insulation layer is formed on outer surfaces of the plug in the first semiconductor and the second connection portion In an exemplary embodiment, the second insulation layer may surround outer sidewalls of the plug protruding from the second surface.

In an exemplary embodiment, a lower surface of the plug may be exposed by the second insulation layer.

According to exemplary embodiments of the inventive concept, in a method of manufacturing a semiconductor device, after a first insulation layer and a sacrificial layer are formed on a lower surface of a substrate, an opening is formed in the substrate, a second insulation layer is formed in the opening and then a plug is formed to fill the opening. Then, a lower portion of the plug is exposed. Accordingly, before exposing the lower portion of the plug, the lower surface of the substrate is already coated with the first insulation layer. Further, the outer sidewalls of a second connection portion of the plug, that is, a lower portion of the plug, is already coated with the second insulation layer.

Thus, during a process for exposing a lower portion of a plug including a metal having high diffusivity, such as copper, a silicon substrate is already coated with the first and second insulation layers. Therefore, during subsequent processes, such as etch processes, the metal of the plug may be prevented from diffusing into the substrate, thus improving the electrical reliability of a semiconductor device.

BRIEF DESCRIPTION OF THE DRAWINGS

FIG. 1 is a cross-sectional view illustrating a semiconductor device in accordance with an exemplary embodiment.

FIGS. 2 to 9 are cross-sectional views illustrating a method of manufacturing a semiconductor device in accordance with an exemplary embodiment.

FIG. 10 is a cross-sectional view illustrating a semiconductor device in accordance with another exemplary embodiment.

FIG. 11 is an enlarged view illustrating the "A" portion in FIG. 10.

FIG. 12 is a cross-sectional view illustrating a method of manufacturing a semiconductor device in accordance with another exemplary embodiment.

DETAILED DESCRIPTION OF EXEMPLARY EMBODIMENTS

Figure 1:
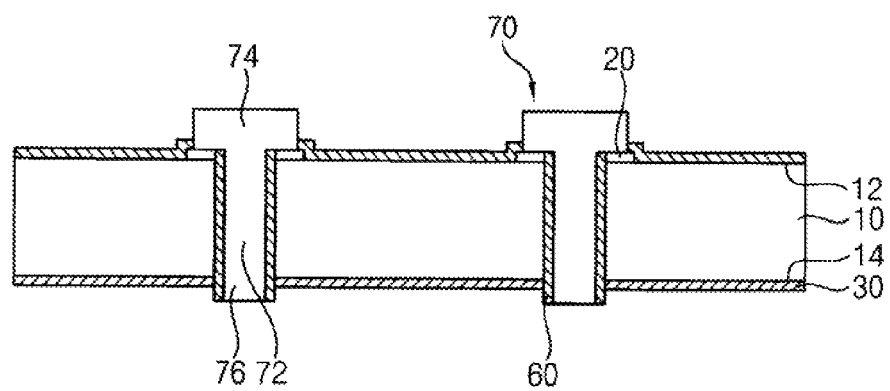
FIGS. 1 to 12 represent non-limiting, exemplary embodiments as described herein.

Various exemplary embodiments will be described more fully hereinafter with reference to the accompanying drawings, in which exemplary embodiments are shown. Exemplary embodiments may, however, be embodied in many different forms and should not be construed as limited to example embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. Like numerals refer to like elements throughout.

Hereinafter, exemplary embodiments will be explained in detail with reference to the accompanying drawings.

FIG. 1 is a cross-sectional view illustrating a semiconductor device in accordance with an exemplary embodiment of the inventive concept.

Referring to FIG. 1, a semiconductor device includes a substrate 10, a first insulation layer 30, a second insulation layer 60 and a plug 70. The semiconductor device may be a semiconductor chip including a plug formed therein.

In an exemplary embodiment, the substrate 10 may include a plurality of circuit elements formed therein. The circuit elements may include a plurality of memory devices. Examples of memory devices include volatile memory devices and non-volatile memory devices. Examples of volatile memory devices include a DRAM, an SRAM, etc. Examples of non-volatile memory devices include an EPROM, an EEPROM, a Flash EEPROM, etc.

The substrate 10 may have a first surface 12 and a second surface 14 opposite to the first surface 12. A plurality of chip pads 20 may be formed on the first surface 12 of the substrate 10. Input/output signals may be input/output to/from the circuit elements through the chip pads 20.

The substrate 10 may have a plurality of through-holes formed therein. The plug 70 may fill a through-hole. Both end portions of the plug 70 may be exposed through the first and second surfaces 12 and 14 of the substrate 10, respectively.

In an exemplary embodiment, the plug 70 may be formed in a region where the chip pad 20 has been formed, so that the plug 70 penetrates the chip pad 20. Alternatively, a redistribution pad (not illustrated) may be formed on the first surface 12 of the substrate 10. In this case, the plug 70 may be formed to penetrate the redistribution pad instead of the chip pad.

For example, the plug 70 may include a conductive electrode and a conductive protection layer formed on the conductive electrode. The conductive electrode may include copper (Cu), tungsten (W), gold (Au), silver (Ag), platinum (Pt), etc. In this embodiment, the conductive electrode may include copper (Cu). The conductive protection layer may be formed on outer surfaces of the conductive electrode to protect the conductive electrode. The conductive protection layer may be formed using a conductive material having low diffusivity and oxidation. The conductive protection layer may be a conductive layer having good wettability to solder. In this embodiment, the conductive protection layer may include nickel (Ni) or nickel/silver (Ni/Ag).

In an exemplary embodiment, the plug 70 may include a body portion 72, a first connection portion 74 and a second connection portion 76. The body portion 72 may be formed in the through-hole of the substrate 10. The first connection portion 74 may extend from the body portion 72. The first connection portion 74 may be exposed through the first surface 12 of the substrate 10. The second connection portion 76 may extend from the body portion 72. The second connection portion 76 may be exposed through the second surface 14 of the substrate 10.

The first insulation layer 30 may be formed on the second surface 14 of the substrate 10. The first insulation layer 30 may cover the second surface 14 of the substrate 10 except the through-holes. For example, the first insulation layer 30 may be formed using an insulating material having good insulating properties. Examples of insulating materials include oxides, nitrides, etc. These may be used alone or in mixtures thereof. The first insulation layer 30 may be formed by a chemical vapor deposition (CVD) process, a plasma enhanced chemical vapor deposition (PECVD) process, an atomic layer deposition (ALD) process, a low pressure chemical vapor deposition (LPCVD) process, a sputtering process, etc. Alternatively, the first insulation layer 30 may be formed using a polymer by a spin coating process or a spray process.

The second insulation layer 60 may be formed in the through hole between the plug 70 and the substrate 10 to electrically insulate between the plug 70 from the substrate 10. The second insulation layer 60 may be further formed to cover the first surface 12 of the substrate 10. In this case, the chip pad 20 may be partially exposed by the second insulation layer 60. Alternatively, an insulation layer such as a passivation layer may be formed on the first surface 12 of the substrate 10.

The second insulation layer 60 may be formed on the outer surfaces of the plug 70 in the through-hole. The second insulation layer 60 may be further formed on the outer surfaces of the second connection portion 76 of the plug 70 that protrudes from the second surface 14 of the substrate 10. Accordingly, the second insulation layer 60 may be formed on the outer surfaces of the body portion 72 and the second connection portion 76 of the plug 70.

For example, the second insulation layer 60 may be formed by a chemical vapor deposition (CVD) process, a plasma enhanced chemical vapor deposition (PECVD) process, an atomic layer deposition (ALD) process, a low pressure chemical vapor deposition (LPCVD) process, a sputtering process, etc. The second insulation layer 60 may be formed using an insulating material having an etch selectivity that differs with respect to that of a sacrificial layer as described below. Examples of insulating materials include oxides, nitrides, etc. These may be used alone or in mixtures thereof.

In an exemplary embodiment, a first connection member (not illustrated) such as solder may be formed on an upper surface of the first connection portion 74. Accordingly, the semiconductor device may be electrically connected via the first connection member to another semiconductor device that is stacked on the first surface 12 of the substrate 10. A second connection member (not illustrated), for example, solder or bonding wire, may be formed on a lower surface of the second connection portion 76. Accordingly, the semiconductor device may be electrically connected via the second connection member to a mounting substrate that is adhered to the second surface 14 of the substrate 10.

In an exemplary embodiment, the first insulation layer 30 is coated on the second surface 14 of the substrate 10 and the second insulation layer 60 is coated on the outer surface of the second connection portion 76 before exposing the second connection portion 76, that is, a lower portion of the plug 70.

Accordingly, when the plug includes a metal having high diffusivity, such as copper, the first and second insulation layers 30 and 60 may prevent the metal from diffusing into the silicon substrate 10 during an etch process for exposing the lower portion of the plug 70. Thus, a metal having high diffusivity may be prevented from polluting the semiconductor chip to thereby improve electrical reliability of the semiconductor chip.

Hereinafter, a method of manufacturing a semiconductor device in accordance with an exemplary embodiment of the inventive concept will be explained.

FIGS. 2 to 9 are cross-sectional views illustrating a method of manufacturing a semiconductor device in accordance with an exemplary embodiment of the inventive concept.

Figure 2:
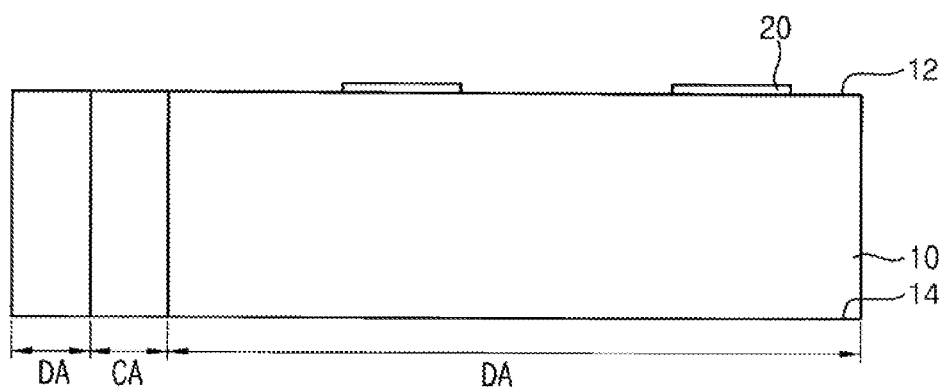

Referring to FIG. 2, a substrate 10 including preliminary semiconductor chips formed therein is prepared. The substrate 10 may have a first surface 12 and a second surface 14 opposite to the first surface 12.

In an exemplary embodiment, the substrate 10 may be a silicon wafer. The wafer may include a die region (DA) and a cutting region (CA). The preliminary semiconductor chips may be formed in the die region (DA). The preliminary semiconductor chips may be separated by the cutting region (CA). The cutting region (CA) may be removed by a subsequent sawing process to form semiconductor chips respectively separated from the preliminary semiconductor chips.

A plurality of chip pads 20 may be formed on the first surface 12 of the substrate 10. The preliminary semiconductor chip may include a plurality of circuit elements formed therein.

Figure 3:
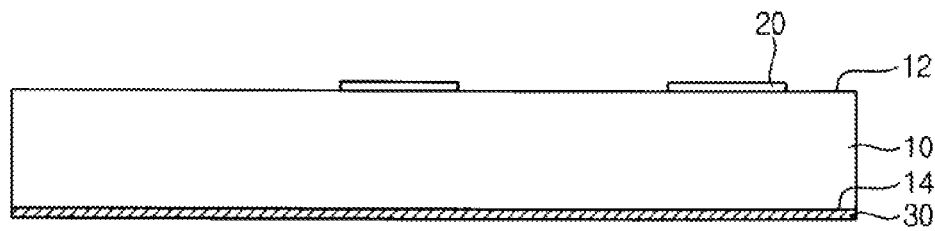

Referring to FIG. 3, the second surface 14 of the substrate 10 is partially removed, after which a first insulation layer 30 is formed on the second surface 14 of the substrate 10.

In an exemplary embodiment, the entire second surface 14 of the substrate may be partially removed by a planarization process or an etch process. For example, the second surface 14 of the substrate 10 may be removed by a chemical mechanical polishing process. In this case, after a supporting wafer (not illustrated) is adhered to the first surface 12 of the substrate 10, the entire second surface 14 of the substrate 10 may be partially removed. The thickness of the remaining substrate 10 may be determined taking into account the length of the plug, warping of the substrate during the manufacturing processes, etc.

The first insulation layer 30 is formed on the second surface 14 of the substrate 10. For example, the first insulation layer 30 may be formed using a material having good insulating properties. Examples of insulating materials include oxides and nitrides, etc. These may be used alone or in mixtures thereof. The first insulation layer 30 may be formed by a chemical vapor deposition (CVD) process, a plasma enhanced chemical vapor deposition (PECVD) process, an atomic layer deposition (ALD) process, a low pressure chemical vapor deposition (LPCVD) process, a sputtering process, etc. Alternatively, the first insulation layer 30 may be formed using a polymer by a spin coating process or a spray process.

Figure 4:
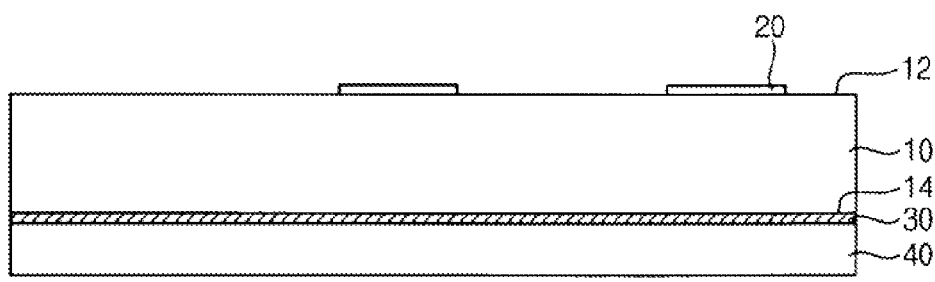

Referring to FIG. 4, a sacrificial layer 40 is formed on the first insulation layer 30. The sacrificial layer may be formed using an insulating material having an etch selectivity that differs with respect to that of the first insulation layer 30. For example, the sacrificial layer 40 may be formed using polymer having an etch selectivity that differs with respect to that of the first insulation layer 30. The thickness of the sacrificial layer 40 may be smaller than that of the substrate 10. The thickness of the sacrificial layer 40 may be determined by taking into account the length of the exposed portion of the plug from the second surface 14, etc.

Figure 5:
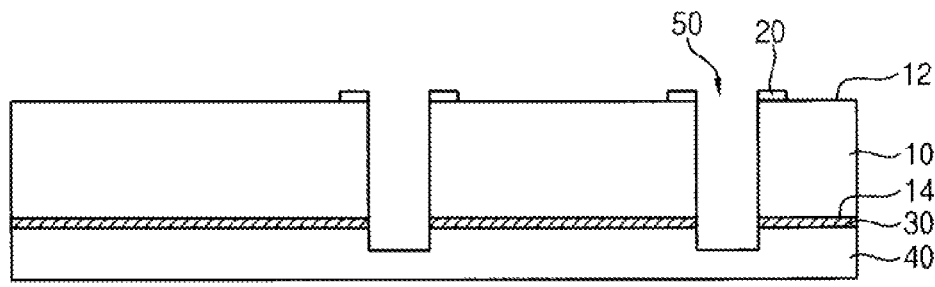

Referring to FIG. 5, an opening 50 is formed in the substrate 10 having the sacrificial layer 40 formed thereon. The opening 50 may penetrate through the substrate 10 and extend into a portion of the sacrificial layer 40.

In an exemplary embodiment, the opening 50 may be formed in the substrate 10 of the supporting wafer to extend from the first surface 12 into the portion of the sacrificial layer 40. For example, the opening 50 may be formed by a laser drilling process, a wet etch process, a dry etch process, etc.

The opening 50 penetrates through the substrate 10 and the first insulation layer 30 and extends into the portion of the sacrificial layer 40. Accordingly, the substrate 10 may be exposed through a sidewall of the opening 50 and the sacrificial layer 40 may be exposed through the sidewall and a bottom face of the opening 50.

In this case, the opening 50 may be formed on a region where the chip pad 20 has been formed, so that the opening 50 penetrates the chip pad 20. Alternatively, the opening 50 may be formed on a redistribution pad (not illustrated), so that the opening 50 penetrates the redistribution pad. The redistribution pad may be formed on the first surface 12 of the substrate 10 to be electrically connected to the chip pad 20.

Figure 6:
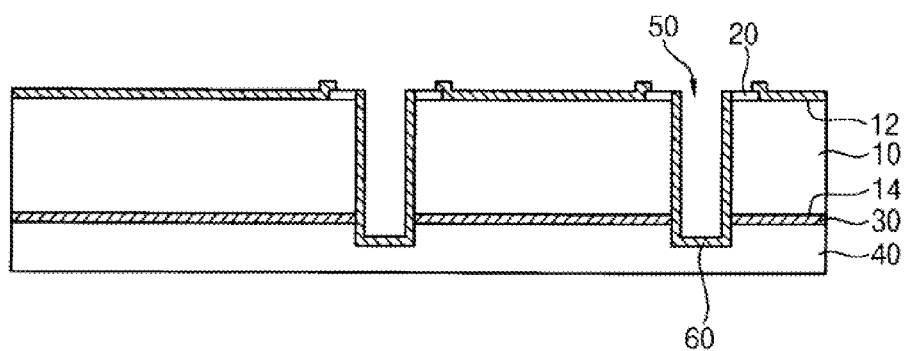

Referring to FIG. 6, a second insulation layer 60 is formed on inner walls of the opening 50.

In an exemplary embodiment, the second insulation layer 60 may be formed on the inner walls of the opening 50 and the first surface 12 of the substrate 10. For example, the second insulation layer 60 may be formed by a chemical vapor deposition (CVD) process, a plasma enhanced chemical vapor deposition (PECVD) process, an atomic layer deposition (ALD) process, a low pressure chemical vapor deposition (LPCVD) process, a sputtering process, etc. The second insulation layer 60 may be formed using an insulating material having an etch selectivity that differs with respect to that of a sacrificial layer as described below. Examples of insulating materials include oxides and nitrides, etc. These may be used alone or in mixtures thereof. Then, the second insulation layer 60 may be patterned to partially expose the chip pads 20.

The second insulation layer 60 may be formed on at least the silicon substrate 10 exposed by opening 50. The second insulation layer 60 may prevent an electrical short between the sidewall of the opening and a plug filling the opening 50. Accordingly, the second insulation layer 60 may serve as a via-insulating layer.

Figure 7:
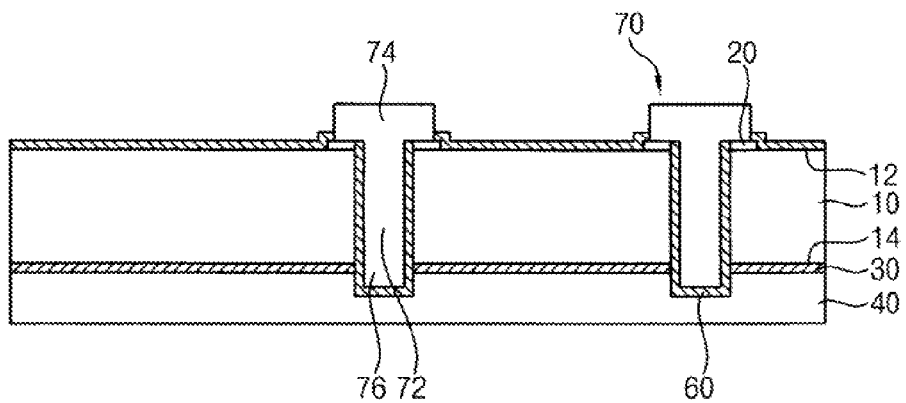

Referring to FIG. 7, a plug 70 is formed to fill the opening 50.

In an exemplary embodiment, a seed layer (not illustrated) may be formed on the first surface 12 of the substrate 10 including the opening 50. The seed layer may be formed by a sputtering process. The seed layer may be formed using a metal having good adhesivity and wettability to a plug that is formed by a subsequent process. The seed layer may include titanium/copper (Ti/Cu), titanium/palladium (Ti/Pd), titanium/nickel (Ti/Ni), or chromium/copper (Cr/Cu). These may be used alone or in combinations thereof.

Then, an electroplating process may be performed to form the plug 70 filling the opening 50. After a mask (not illustrated) is formed on the first surface 12 of the substrate 10 to expose the opening 50 and a portion of the first surface 12, the opening 50 and the exposed portion of the first surface 12 is dipped in a plating solution. The seed layer may be used as an electrode to form the plug 70 that fills the opening 50. For example, the plug 70 may include gold (Au), silver (Ag), copper (Cu), platinum (Pt), etc.

In an exemplary embodiment, a conductive protection layer (not illustrated) is formed on the seed layer, after which an electroplating process may form a conductive electrode. For example, the conductive protection layer may be formed using an oxidizing conductive material having low diffusivity. The conductive protection layer may be a conductive layer having good wettability to solder. The conductive protection layer may be formed by an electroplating process, a chemical vapor deposition process, a physical vapor deposition process, etc.

In this embodiment, the conductive protection layer may include nickel (Ni) or nickel/silver (Ni/Ag). Accordingly, the plug 70 may include the conductive electrode and the conductive protection layer formed on outer surfaces of the conductive electrode. The conductive protection layer may be formed on the outer surfaces of the conductive electrode to protect the conductive electrode.

Alternatively, the plug 70 may be formed by a chemical vapor deposition process or a physical vapor deposition process, or the plug 70 may be formed by repeatedly performing a film forming process and an etch-back process.

In an exemplary embodiment, the plug 70 may include a body portion 72, a first connection portion 74 and a second connection portion 76. The body portion 72 may be formed on the sidewalls of the opening 50. The first connection portion 74, that is an upper portion of the plug 70, may extend from the body portion 72 and protrude from the first surface 12 of the substrate 10. The second connection portion 76, that is, a lower portion of the plug 70, may extend from the body portion 72 and protrude from the second surface 14 of the substrate 10.

Figure 8:
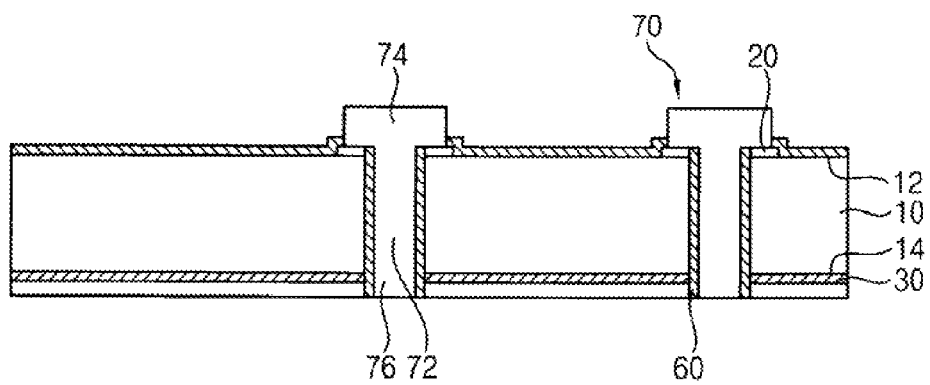
Figure 9:
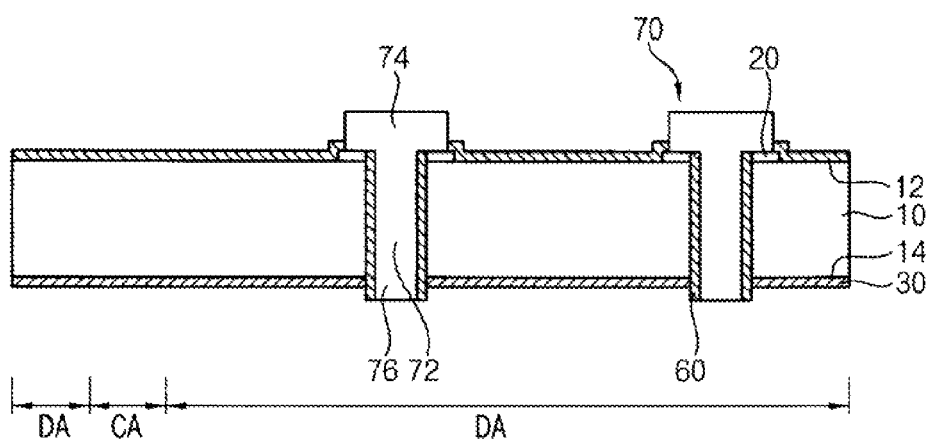

Referring to FIGS. 8 and 9, the sacrificial layer 40 is removed from the second surface 14 of the substrate 10 to expose the lower portion of the plug 70 through the second surface 14 of the substrate 10.

In an exemplary embodiment, as illustrated in FIG. 8, the sacrificial layer 40 is partially removed to expose the second insulation layer 60 on a lower surface of the second connection portion 76 of the plug 70. For example, the sacrificial layer 40 may be removed by a dry etch process or a wet etch process. Then, the second insulation layer 60 exposed by the sacrificial layer 40 is removed to expose the lower surface of the second connection portion 76 of the plug 70. Since the second insulation layer 60 has an etch selectivity that differs with respect to that of the sacrificial layer 40, a portion of the second insulation layer 60 may be selectively removed by a dry etch process or a wet etch process.

Then, as illustrated in FIG. 9, the remaining sacrificial layer 40 is removed to expose the lower portion of the plug 70, that is, the second connection portion 76 through the second surface 14 of the substrate 10. Since the sacrificial layer 40 has an etch selectivity that differs with respect to that of the first and second insulation layers 30 and 40, the sacrificial layer 40 may be selectively removed by a dry etch process or a wet etch process.

Alternatively, after the sacrificial layer 40 is partially removed by a chemical mechanical polishing process to expose the lower surface of the second connection portion 76, the remaining portion of the sacrificial layer 40 may be removed by a dry etch process or a wet etch process. Accordingly, the lower portion of the plug 70, that is, the second connection portion 76, may be exposed.

Then, the cutting region (CA) of the substrate 10 is removed by a sawing process to form semiconductor chips respectively separated from the preliminary semiconductor chips.

A semiconductor device manufactured by above-mentioned processes may include a semiconductor chip and a plug 70 penetrating the semiconductor chip. The plug 70 may include a first connection portion 74 protruding from the first surface 12 of the substrate 10 and a second connection portion 76 protruding from the second surface 14 of the substrate 10.

According to an exemplary embodiment of the inventive concept, after the first insulation layer 30 and the sacrificial layer 40 are formed on the second surface 14 of the substrate 10, the lower portion of the plug 70, that is, the second connection portion 76 may be exposed through the second surface 14 of the substrate 10. Accordingly, the first insulation layer 30 is coated on the second surface 14 of the substrate 10 before exposing the second connection portion 76 of the plug 70. Further, the second insulation layer 60 is also coated on the outer surfaces (outer sidewalls) of the second connection portion 76 before exposing the second connection portion 76.

Accordingly, when the lower portion of the plug 70 including a metal having high diffusivity, such as copper, is exposed, the first insulation layer 30 is already coated on the silicon substrate 10. Therefore, while performing subsequent processes, such as etch processes, the metal in the plug 70 may be prevented from diffusing into the substrate 10, thereby improving electrical reliability of the semiconductor chip.

Further, after the plug 70 is formed using the sacrificial layer 40, the sacrificial layer 40 may be removed to expose the lower portion of the plug 70. Accordingly, the lower portion of the plug 70 may protrude from the lower surface of the substrate with a uniform height.

Figure 10:
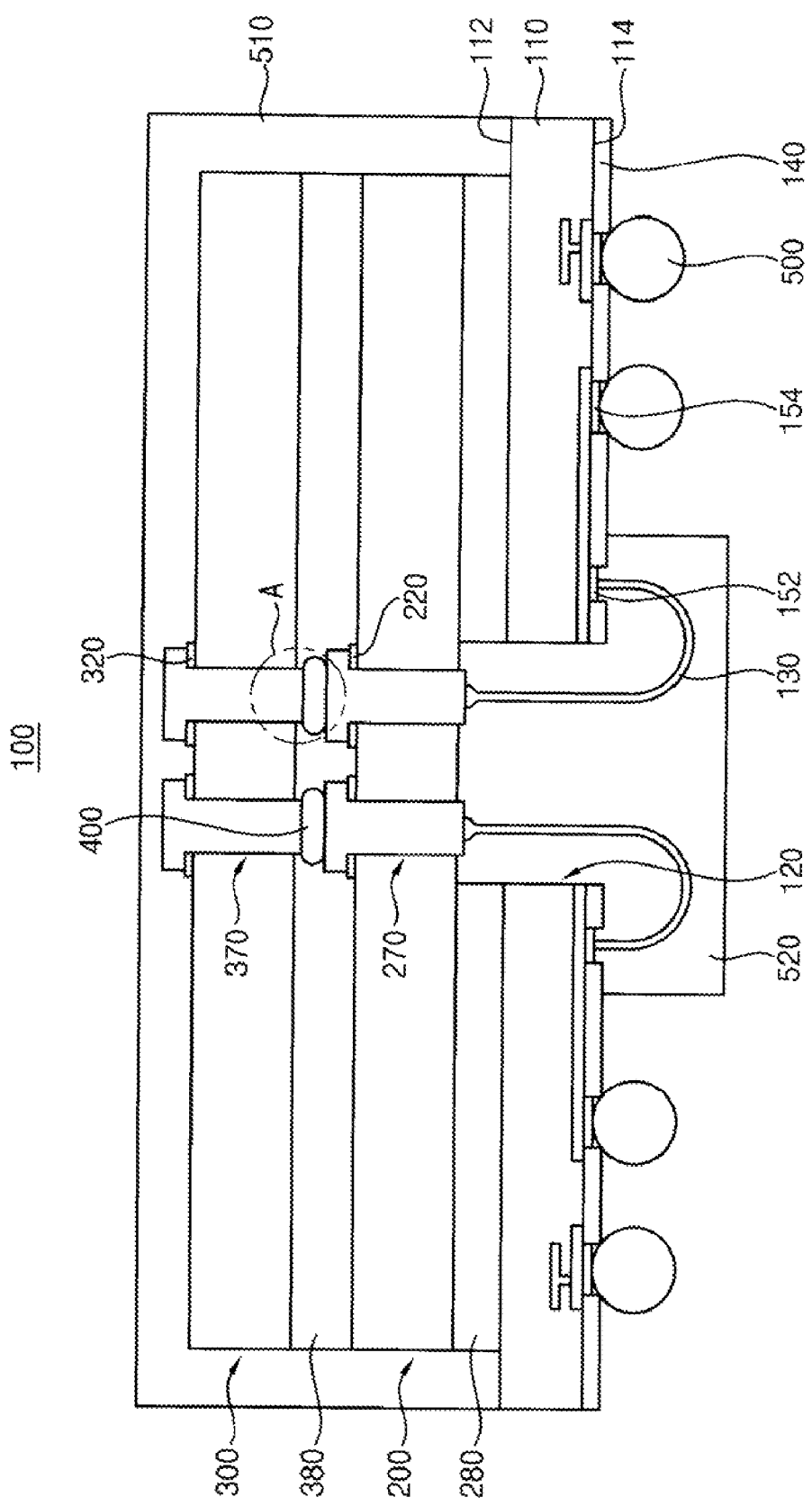
Figure 11:
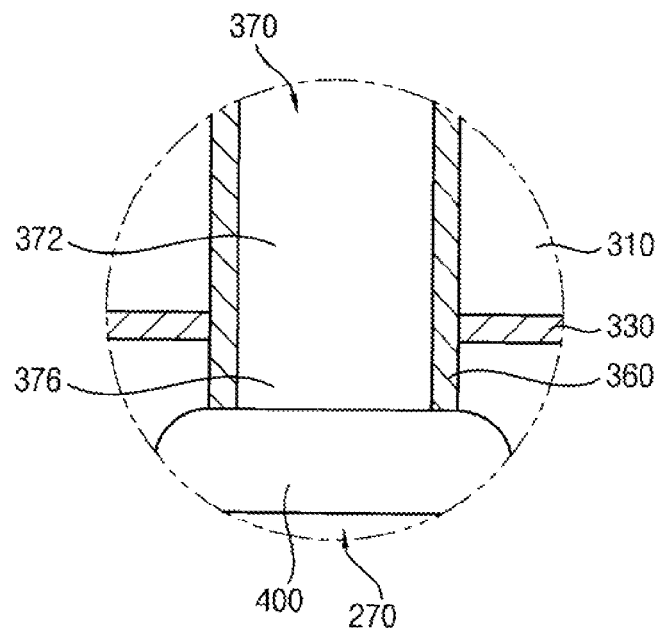

FIG. 10 is a cross-sectional view illustrating a semiconductor device in accordance with another exemplary embodiment of the inventive concept. FIG. 11 is an enlarged view illustrating the "A" portion in FIG. 10.

Referring to FIGS. 10 and 11, a semiconductor device 100 according to another exemplary embodiment includes a mounting substrate 110 and first and second semiconductor chips 200 and 300 stacked on the mounting substrate 110. The semiconductor device according to another exemplary embodiment may be a stack package including stacked first and second semiconductor chips.

In another exemplary embodiment, the mounting substrate 110 may be a printed circuit board (PCB). The PCB may be a multi-layered circuit board that includes plugs and various circuit patterns formed therein.

A window 120 may be formed in the middle region of the mounting substrate 110. A plurality of bonding pads 152 may be formed in the middle region of the mounting substrate 110. The bonding pads 152 may be arranged near the window 120. The bonding pads 52 may be spaced apart from one another along a side of the window 120. Outer connection pads 154 may be formed on a peripheral region of the mounting substrate 110.

The first semiconductor chip 200 may be mounted on the mounting substrate 110. For example, the first semiconductor chip 200 may be mounted on the mounting substrate 110 by a first adhesive film 280. The second semiconductor chip 300 may be mounted on the first semiconductor chip 200. For example, the second semiconductor chip 300 may be mounted on the first semiconductor chip 200 by a second adhesive film 380. The first and second adhesive films 280 and 380 may include epoxy, polyimide, etc.

In another exemplary embodiment, the first semiconductor chip 200 may include a first plug 270 penetrating the first semiconductor chip 200. The second semiconductor chip 300 may include a second plug 370 penetrating the second semiconductor chip 300. The first plug 270 may be formed in a region to penetrate a first chip pad 220 of the first semiconductor chip 200.

Second chip pads 320 of the second semiconductor chip 300 may be arranged in the middle region of the second semiconductor chip 300 corresponding to the first chip pads 220. The second plug 370 may be formed in a region to penetrate the second chip pad 320.

The first plug 270 of the first semiconductor chip 200 may be electrically connected to the second plug 370 of the second semiconductor chip 300 by a connection member 400, such as solder. Accordingly, the first and second semiconductor chips 200 and 300 may be electrically connected to each other by the first and second plugs 270 and 370.

Other semiconductor chips may be stack mounted on the second semiconductor chip 300, and the number of the stacked semiconductor chips should not be construed as limited thereto.

Further, although the first and second semiconductor chips 200 and 300 include the first and second chip pads 220 and 320 in the middle region, it should be understood that a plurality of stacked semiconductor chips may include chip pads arranged in a peripheral region, but in the middle region thereof.

In another exemplary embodiment, a lower portion of the first plug 270 may be exposed through a lower surface of the first semiconductor chip 200. A bonding wire 130 may extend from the exposed lower portion of the plug 270 through the window 120 of the mounting substrate to the bonding pad to electrically connect the first semiconductor chip 200 to the mounting substrate 110. A solder ball 500 for an electrical interconnection with an external device may be disposed on the outer connection pad 154 on a second surface 114 of the mounting substrate 110.

The semiconductor device 100 may include a first molding member 510. The first molding member 510 may be formed on a first surface 112 of the mounting substrate 110 to cover the first and second semiconductor chips 200 and 300. The semiconductor device 100 may include a second molding member 520. The second molding member 510 may be formed to cover the bonding wires 130 and the window 120 of the mounting substrate 110.

Referring again to FIG. 11, in another exemplary embodiment, the second plug 370 may include a body portion 372, a first connection portion (not shown) and a second connection portion 376. The first connection portion of the second plug 370 may extend from the body portion 372 and protrude from an upper surface of the second semiconductor chip 300. The second connection portion 376 of the second plug 370 may extend from the body portion 372 and protrude from a lower surface of the second semiconductor chip 300.

A first insulation layer 330 may be formed on the lower surface of the second semiconductor chip 300. The first insulation layer 330 may be formed to cover the lower surface of the second semiconductor chip 300 except the second plug 370. For example, the first insulation layer 330 may include a material having good insulating properties.

A second insulation layer 360 may be formed between the second plug 370 and a substrate 310 of the second semiconductor chip 300 to electrically insulate the second plug 370 from the substrate 310. The second insulation layer 360 may be formed on outer surfaces of the second plug 370 in the substrate 310. The second insulation layer 360 may be further formed on the outer surfaces of the second connection portion 376 of the second plug 370 that protrudes from the lower surface of the second semiconductor chip 300. Accordingly, the second insulation layer 360 may be formed on the outer surfaces of the body portion 372 and the second connection portion 376 of the plug 370.

In another exemplary embodiment, the first insulation layer 330 is already coated on the lower surface of the second semiconductor chip 300 and the second insulation layer 360 is already coated on the outer sidewalls of the second connection portion 76 before the second connection portion 376 of the second plug 370 is exposed.

Accordingly, during an etch process for exposing the lower portion of the second plug 370 including a metal having high diffusivity, such as copper, the first and second insulation layers 330 and 360 may prevent the metal from diffusing into the substrate 310 of the semiconductor chip, thus improving electrical reliability of the semiconductor chip. Further, the process of exposing the lower portion of the second plug 370 may be easily and accurately controlled, and thus, the second connection portion 376 may protrude from the lower surface of the substrate 310 with a uniform height.

Hereinafter, a method of manufacturing a semiconductor device in accordance with another exemplary embodiment will be explained.

Figure 12:
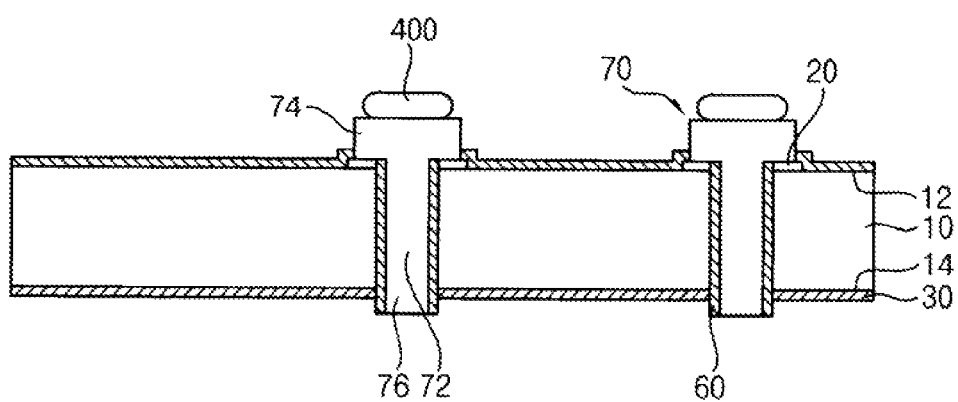

FIG. 12 is a cross-sectional view illustrating a method of manufacturing a semiconductor device in accordance with another exemplary embodiment of the inventive concept.

First, processes such as those illustrated in FIGS. 2 to 7 are performed on an opening 50 in a substrate 10 having a first insulation layer 30 and a sacrificial layer 40 formed thereon, and then, a plug 70 is formed to fill the opening 50 on which a second insulation layer 60 is formed. The opening 50 may be formed in the substrate 10 to extend from a first surface 12 of the substrate 10 into a portion of the sacrificial layer 40.

Referring to FIG. 12, in another exemplary embodiment, a connection member 400 is formed on a first connection portion 74 of the plug 70 exposed through the first surface 12 of the substrate 10. For example, the connection member may include solder.

Then, during processes such as those illustrated in FIGS. 8 and 9, the sacrificial layer 40 is removed to expose the second connection portion 76 of the plug 70 through a second surface 14 of the substrate 10. The cutting region (CA) of the substrate 10 is removed by a sawing process to form semiconductor chips respectively separated from the preliminary, semiconductor chips.

Referring again to FIG. 10, separated first and second semiconductor chips 200 and 300 are mounted on a mounting substrate 110 to complete a stack package 100.

In another exemplary embodiment, the first semiconductor chip 200 and the second semiconductor chip 300 may be electrically connected to each other by the connection member 400 formed on the first plug 270 of the first semiconductor chip 200. Bonding wires 130 extend from the exposed lower portion of the first plug 270 of the first semiconductor chip 200 to electrically connect the first semiconductor chip 200 to the mounting substrate 110.

Accordingly, the stack package 100 according to exemplary embodiments of the inventive concept may input and/or output signals using the electrical connection member and the first and second plugs 270 and 370. In this case, the first and second plugs 270 and 370 may be used as relatively short signal routes to thereby minimize electrical loading of the stack package.

As mentioned above, in a method of manufacturing a semiconductor device according to an embodiment of the inventive concept, after a first insulation layer and a sacrificial layer are formed on a lower surface of a substrate, an opening is formed in the substrate, a second insulation layer is formed in the opening and then a plug is formed to fill the opening. Then, a lower portion of the plug is exposed. Accordingly, before exposing the lower portion of the plug, the lower surface of the substrate is already coated with the first insulation layer. Further, outer sidewalls of a second connection portion of the plug, that is, a lower portion of the plug, are already coated with the second insulation layer.

Thus, during a process for exposing the lower portion of the plug including a metal having high diffusivity, such as copper, the silicon substrate is already coated with the first and second insulation layers. Therefore, during subsequent processes, such as etch processes, the metal of the plug may be prevented from diffusing into the substrate, thus improving electrical reliability of a semiconductor device.

The foregoing is illustrative of exemplary embodiments of the inventive concept and is not to be construed as limiting thereof. Although a few exemplary embodiments have been described, those skilled in the art will readily appreciate that many modifications are possible in other exemplary embodiments without materially departing from the novel teachings of the embodiments of the present inventive concept. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. A method of manufacturing semiconductor device, comprising:

preparing a substrate having a first surface and a second surface opposite to the first surface;

forming a first insulation layer on the second surface;

forming a sacrificial layer on the first insulation layer;

forming an opening that penetrates through the substrate and extends from the first surface into a portion of the sacrificial layer;

forming a second insulation layer on an inner wall of the opening;

forming a plug filling the opening; and removing the sacrificial layer to expose a lower portion of the plug through the second surface, wherein removing the sacrificial layer comprises partially removing the sacrificial layer to expose the second insulation layer on a lower surface of the plug;

removing the exposed second insulation layer to expose the lower surface of the plug; and completely removing the sacrificial layer.

2. The method of claim 1, further comprising partially removing the second surface of the substrate, prior to forming the first insulation layer.

3. The method of claim 1, wherein the sacrificial layer is formed using an insulating material having an etch selectivity that differs with respect to that of the first insulation layer.

4. The method of claim 3, wherein the sacrificial layer comprises a polymer.

5. The method of claim 1, wherein the second insulation layer is formed using an insulating material having an etch selectivity that differs with respect to that of the sacrificial layer.

6. The method of claim 1, wherein the plug is formed by an electroplating process.

7. The method of claim 1, wherein the sacrificial layer is partially and completely removed by an etch process to expose the second insulation layer on the lower surface of the plug.

8. The method of claim 1, further comprising forming a connection member on the plug exposed through the first surface.

9. The method of claim 8, further comprising adhering a second semiconductor device to the first surface of the substrate, the second semiconductor device being electrically connected to the first semiconductor chip by the connection member.

10. The method of claim 8, wherein the connection member comprises solder.

11. A method of manufacturing semiconductor device, comprising:

preparing a substrate having a first surface and a second surface opposite to the first surface;

forming a first insulation layer on the second surface;

forming a sacrificial layer on the first insulation layer;

forming an opening that penetrates through the substrate and extends from the first surface into a portion of the sacrificial layer;

forming a second insulation layer on an inner wall of the opening;

forming a plug filling the opening; and removing the sacrificial layer to expose a lower portion of the plug through the second surface, wherein removing the sacrificial layer comprises partially removing the sacrificial layer by a first process to expose a lower surface of the plug; and completely removing the sacrificial layer by a second process.

12. The method of claim 11, further comprising partially removing the second surface of the substrate, prior to forming the first insulation layer.

13. The method of claim 11, wherein the sacrificial layer is formed using an insulating material having an etch selectivity that differs with respect to that of the first insulation layer.

14. The method of claim 13, wherein the sacrificial layer comprises a polymer.

15. The method of claim 11, wherein the second insulation layer is formed using an insulating material having an etch selectivity that differs with respect to that of the sacrificial layer.

16. The method of claim 11, wherein the plug is formed by an electroplating process.

17. The method of claim 11, wherein the first process is a chemical mechanical polishing process.

18. The method of claim 17, wherein the second process is an etch process.

19. The method of claim 11, further comprising forming a connection member on the plug exposed through the first surface, wherein the connection member comprises solder.

20. The method of claim 19, further comprising adhering a second semiconductor device to the first surface of the substrate, the second semiconductor device being electrically connected to the first semiconductor chip by the connection member.

* * * * *